United States Patent
Guan et al.

(10) Patent No.: US 9,620,584 B2
(45) Date of Patent: Apr. 11, 2017

(54) INTEGRATED SCHOTTKY DIODE IN HIGH VOLTAGE SEMICONDUCTOR DEVICE

(71) Applicants: Lingpeng Guan, Santa Clara, CA (US);
Anup Bhalla, Santa Clara, CA (US);
Madhur Bobde, San Jose, CA (US);
Tinggang Zhu, Cupertino, CA (US)

(72) Inventors: Lingpeng Guan, Santa Clara, CA (US);
Anup Bhalla, Santa Clara, CA (US);
Madhur Bobde, San Jose, CA (US);
Tinggang Zhu, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 158 days.

(21) Appl. No.: 14/454,696

(22) Filed: Aug. 7, 2014

(65) Prior Publication Data
US 2016/0043169 A1   Feb. 11, 2016

Related U.S. Application Data

(62) Division of application No. 12/584,151, filed on Aug. 31, 2009, now Pat. No. 8,829,614.

(51) Int. Cl.
*H01L 29/78* (2006.01)
*H01L 29/06* (2006.01)
(Continued)

(52) U.S. Cl.
CPC .... *H01L 29/0634* (2013.01); *H01L 29/66333* (2013.01); *H01L 29/66712* (2013.01); *H01L 29/7395* (2013.01)

(58) Field of Classification Search
CPC ....... H01L 21/00; H01L 21/331; H01L 21/28; H01L 21/44; H01L 29/78; H01L 29/66;
(Continued)

(56) References Cited

U.S. PATENT DOCUMENTS

2003/0127702 A1*   7/2003   Blair et al. ............ 257/510
2009/0079002 A1*   3/2009   Lee et al. ............. 257/355
(Continued)

*Primary Examiner* — Chuong A Luu
(74) *Attorney, Agent, or Firm* — Bo-In Lin

(57) ABSTRACT

This invention discloses a method for manufacturing a semiconductor power device in a semiconductor substrate comprises an active cell area and a termination area. The method comprises the steps of a) growing and patterning a field oxide layer in the termination area and also in the active cell area on a top surface of the semiconductor substrate b) depositing and patterning a polysilicon layer on the top surface of the semiconductor substrate at a gap distance away from the field oxide layer; c) performing a blank body dopant implant to form body dopant regions in the semiconductor substrate substantially aligned with the gap area followed by diffusing the body dopant regions into body regions in the semiconductor substrate; d) implanting high concentration body-dopant regions encompassed in and having a higher dopant concentration than the body regions and e) applying a source mask to implant source regions having a conductivity opposite to the body region with the source regions encompassed in the body regions and surrounded by the high concentration body-dopant regions.

11 Claims, 17 Drawing Sheets

(51) Int. Cl.
*H01L 29/66* (2006.01)
*H01L 29/739* (2006.01)

(58) Field of Classification Search
CPC ..... H01L 29/739; H01L 29/40; H01L 29/417; H01L 29/423; H01L 21/383; H01L 29/06; H01L 29/10
USPC ....... 438/268, 138, 570, 207, 137, 156, 173, 438/192, 206, 212, 243, 386
See application file for complete search history.

(56) References Cited

U.S. PATENT DOCUMENTS

2011/0049564 A1\* 3/2011 Guan et al. .................... 257/147
2011/0073906 A1\* 3/2011 Bobde et al. ................. 257/147

\* cited by examiner

INTEGRATED SCHOTTKY DIODE IN HIGH VOLTAGE SEMICONDUCTOR DEVICE

This application is a Divisional Application, and claims priority of application Ser. No. 12/584,151 filed on Aug. 31, 2009 now U.S. Pat. No. 8,829,614 by the common inventors of this Application. The benefit of the filing dates are hereby claimed under Title 35 of the United States Code. The disclosures of application Ser. No. 12/584,151 are hereby incorporated by reference.

BACKGROUND OF THE INVENTION

1. Field of the Invention

The invention relates generally to the configurations and methods of manufacturing semiconductor power devices. More particularly, this invention relates to a device configuration and method of manufacturing semiconductor power devices integrated with Schottky diode without requiring additional masks, for reducing the turn off time and the power losses.

2. Description of the Prior Art

There is a great demand for implementing a semiconductor power device by integrating the Schottky diode as an internal diode. Specifically, the HV MOSFET behaves like a P-i-N diode with a negative drain-to-source voltage Vds<0, due to the built-in body diode formed by the P+, P−, and N-epi as shown in FIG. 1A. A high level injection into the N− Epi region from the P-body regions, shown in FIG. 1A, causes large turn off time and losses. Furthermore, a high rate of current variation, i.e., a large di/dt, causes a voltage spike and reduces a "softness factor"S. However, in order to improve the performance of the HV-DMOS, there is a need to reduce the turn off time and losses, i.e., to reduce the reverse recovery charge (Qrr), recovery time (Trr), and to increase the softness factor S. A HV MOSFET when integrated with an internal Schottky diode improves the performance of the HV MOSFET by resolving these technical limitations.

In addition to the above-mentioned demand for implementing the semiconductor power device with an integrated Schottky diode, the semiconductor power devices are widely implemented in a power supply and motor control applications. The semiconductor power devices are often formed with a full bridge type of topology as shown in FIG. 1B. For this type of application, an internal diode is very advantageous to function as a free-wheeling diode. A high voltage MOSFET, a super-junction semiconductor power device, and IGBT devices when implemented for the power supply and motor control applications often suffer from the limitations of high Qrr and power loss. A semiconductor power device when integrating the Schottky diode as an internal diode can resolve these technical problems. However, conventional configurations and methods of manufacturing the semiconductor power devices usually require an additional mask to block an area in order to integrate the Schottky diode as an internal diode of the power device in that area. Production costs are adversely affected due to additional this mask requirement.

For all these reasons, there are great and urgent demands to improve the configurations and method of manufacturing the semiconductor power device to integrate with the Schottky diodes as an internal diode such that the above-discussed technical limitations and difficulties can be resolved.

SUMMARY OF THE PRESENT INVENTION

It is therefore an aspect of the present invention to provide a new and improved method and device configuration to manufacture a semiconductor power device to integrate with a Schottky diode without requiring additional mask.

Specifically, it is an aspect of the present invention to provide improved device configuration and method for manufacturing a semiconductor power device to integrate with Schottky diodes without additional mask while significantly reducing the Qrr, Trr and increasing the softness factor.

It is another aspect of the present invention to provide improved device configuration and method for manufacturing a semiconductor power device to integrate with Schottky diodes by reducing the distance between the edge of the planar gates to the field oxide to form the self-aligned body regions and to covering the top surfaces over the source and body regions with a Schottky metal to function as a source and emitter metal to integrate the Schottky diode directly as part of the transistor cells without increasing the cell pitch such that significantly reduces the Qrr by about 50%, Trr by 20% and increases the softness factor S by about 33%.

Briefly in a preferred embodiment this invention discloses a semiconductor power device disposed in a semiconductor substrate. The semiconductor power device comprises an active cell area and a termination area. The semiconductor power device further comprises a gate comprises a patterned polysilicon layer disposed on a top surface of the semiconductor substrate. The semiconductor power device further comprises a patterned field oxide layer disposed in the termination area and also in the active cell area at a gap area away from the patterned polysilicon layer on the top surface of the semiconductor substrate. The semiconductor power device further comprises doped body regions disposed in the semiconductor substrate substantially diffused from a region aligned with the gap area below the top surface and extended to regions below the patterned polysilicon layer and the patterned field oxide layer. The semiconductor power device further comprises doped source regions encompassed in and having an opposite conductivity type from the body regions. The semiconductor power device further comprises high concentration body-dopant regions encompassed in and having a higher dopant concentration than the body region surrounding the source regions. In another embodiment, the semiconductor power device further comprises a patterned Schottky metal layer covering an area previously occupied by the field oxide layer in the active cell area and subsequently removed from on the top surface of the semiconductor substrate wherein the patterned Schottky metal layer further extends partially into the gap areas for contacting the body regions and the source regions to form integrated Schottky diodes for the semiconductor power device in the active cell area. In another embodiment, the semiconductor power device further comprises shallow body-dopant regions disposed adjacent to the body regions immediately under the Schottky metal layer having a depth significantly shallower than the body regions. In another embodiment, the semiconductor substrate comprises a N-type epitaxial layer for supporting the body-dopant regions of P-type conductivity encompassing the source regions of N-type conductivity therein. In another embodiment, the semiconductor substrate comprises a P-type epitaxial layer for supporting the body-dopant regions of N-type conductivity encompassing the source regions of P-type conductivity therein. In another embodiment, the semiconductor power device further comprises a MOSFET power device. In another embodiment, the semiconductor power device further comprises a N-channel MOSFET power device supported on a N-type semiconductor substrate. In another embodiment, the semiconductor power device further comprises a P-channel MOSFET power device supported on a P-type semiconductor substrate. In another embodiment, the semiconductor power device further comprises an insulate gate bipolar transistor (IGBT) power device. In another embodiment, the semiconductor power device further comprises an insulate gate bipolar transistor (IGBT) power device supported on a N-type semiconductor substrate includes a P-type bottom layer with N-type dopant regions disposed near a bottom surface of the semiconductor substrate corresponding to the integrated Schottky diodes in the active cell area. In another embodiment, the semiconductor power device further comprises a superjunction semiconductor power device comprises alternating N-type and P-type dopant columns is the semiconductor substrate below the body-dopant regions. In another embodiment, the semiconductor power device further comprises a superjunction semiconductor power device disposed in a N-type semiconductor substrate comprises P-type columns underneath the body dopant regions doped with a P-type dopant and N-type columns between the P-type columns.

This invention further discloses a method for manufacturing a semiconductor power device in a semiconductor substrate comprises an active cell area and a termination area. The method comprises steps of A) growing and patterning a field oxide layer in the termination area and also in the active cell area on a top surface of the semiconductor substrate; B) depositing and patterning a polysilicon layer on the top surface of the semiconductor substrate at a gap distance away from the field oxide layer; and C) performing a blank body dopant implant to form body dopant regions in the semiconductor substrate substantially aligned with the gap area followed by diffusing the body dopant regions into body regions in the semiconductor substrate. In another embodiment, the method further includes a step of implanting high concentration body-dopant regions encompassed in and having a higher dopant concentration than the body regions and applying a source mask to implant source regions having a conductivity opposite to the body region with the source regions encompassed in the body regions and surrounded by the high concentration body-dopant regions. In another embodiment, the method further includes a step of depositing an insulation layer on top of the semiconductor power device and applying a contact metal mask to open contact openings and remove the field oxide; and depositing a Schottky metal layer filling in the contact openings to contact the body regions and the source regions to form integrated Schottky diodes for the semiconductor power device in the active cell area. In another embodiment, the method further includes a step of depositing an insulation layer on top of the semiconductor power device and applying a contact metal mask to open contact openings and remove the field oxide; and implanting a shallow body-dopant regions disposed adjacent to the body regions immediately below the top surface of the semiconductor substrate having a depth significantly shallower than the body regions. In another embodiment, the step of implanting the body-dopant regions comprises a step of implanting a P-type dopant to the body dopant region in an N-type epitaxial layer supported on a N-type semiconductor substrate and implanting N-type source regions encompassed in the P-type body-regions. In another embodiment, the step of implanting the body-dopant regions comprises a step of implanting a N-type dopant to the body dopant region in an P-type epitaxial layer supported on a P-type semiconductor substrate and implanting P-type source regions encompassed in the N-type body-regions. In another embodiment, the step of manufacturing the semiconductor power device further comprises a step of manufacturing a MOSFET power device. In another embodiment, the step of manufacturing the semiconductor power device further comprises a step of manufacturing an IGBT power device. In another embodiment, the step of manufacturing the semiconductor power device further comprises a step of manufacturing an IGBT power device in a N-type semiconductor substrate and implanting a P-type bottom layer with N-type dopant regions near a bottom surface of the semiconductor substrate corresponding to the integrated Schottky diodes in the active cell area. In another embodiment, the step of manufacturing the semiconductor power device further comprises a step of manufacturing a superjunction semiconductor power device by forming in the semiconductor substrate alternating N-type and P-type dopant columns in the semiconductor substrate below the body-dopant regions. In another embodiment, the step of manufacturing the semiconductor power device further comprises a step of manufacturing a superjunction semiconductor power device by forming the semiconductor substrate in a N-type semiconductor substrate with P-type columns underneath the body dopant regions doped with a P-type dopant and N-type columns between the P-type columns.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 2-1 is a cross sectional view to show the termination structure of the high voltage MOSFET (HV MOSFET) semiconductor power device integrated with a Schottky diode of this invention.

FIGS. 3A-1 to 3F-1 are a series of corresponding cross sectional views in termination area in each of the processing steps of FIGS. 3A to 3F.

FIG. 6D-1, an anneal process is carried out to diffuse the boron implanted regions to form multiple P-doped columns and FIG. 6D-2 shows a subsection of the figure from FIG. 6D-1 to show the remainder of the steps.

DETAILED DESCRIPTION OF THE METHOD

Figure 1A:
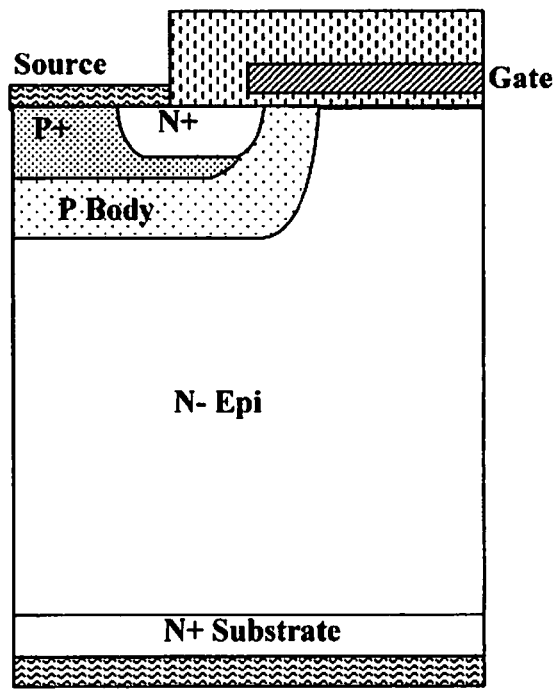
FIG. 1A is a cross sectional view for showing the conventional planar HV MOSFET devices without integrated Schottky diode.
Figure 1B:
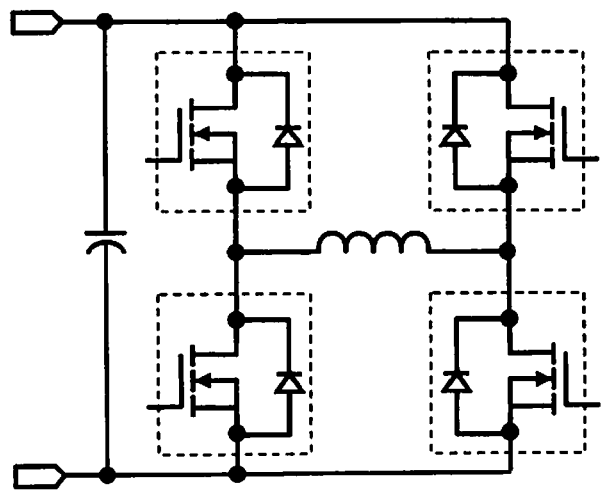
FIG. 1B shows a configuration of a full bridge circuit implemented in a power supply and motor control device
Figure 2:
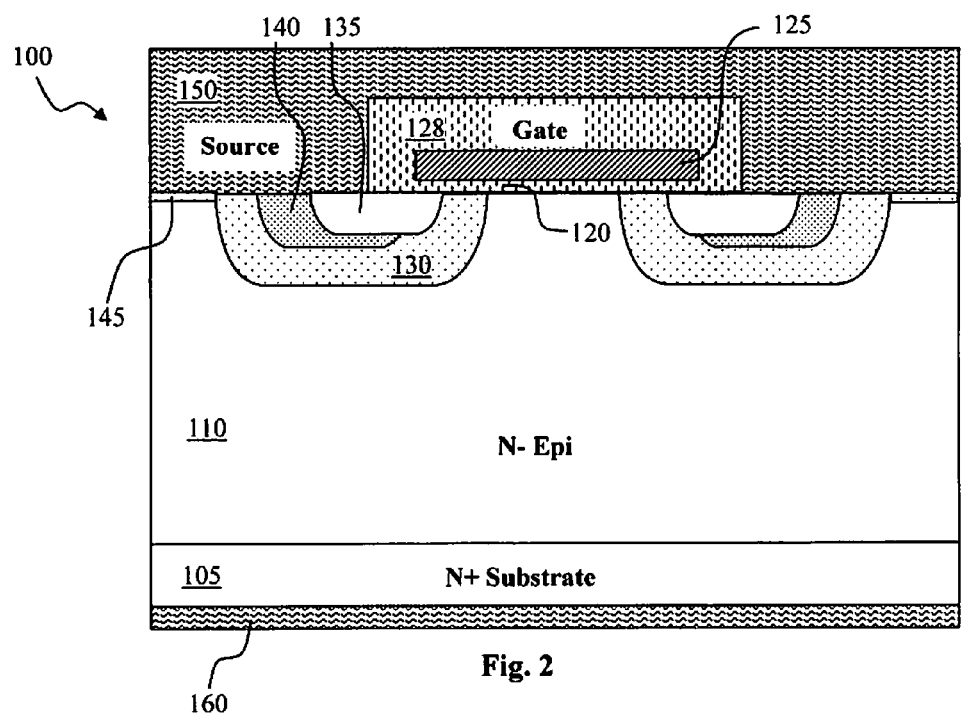
FIG. 2 is a cross sectional view of a HV MOSFET device with an integrated Schottky diode of this invention.
Figures 1, 2:
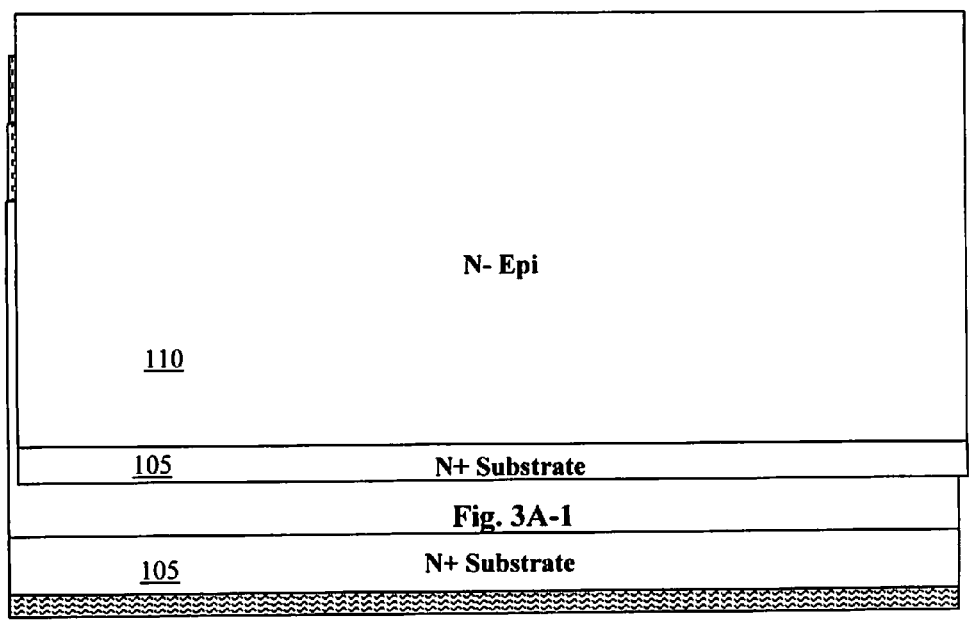

Referring to FIG. 2 for a cross sectional view of active cell 100 of a high voltage MOSFET (HV MOSFET) semiconductor power device that is integrated with a Schottky diode of this invention. The HV MOSFET device is supported on an N+ silicon substrate 105 with an epitaxial layer 110 formed on top of the N+ substrate 105. A planar gate 125 is formed on top of a gate oxide layer 120. A P-body region 130 is formed in the epitaxial layer below the gate oxide layer 120 encompassing an N+ source region 135. The MOSFET device 100 further includes a P+ doped region 140 within the P-body region 130. A source metal 150 covering the top surface with direct contact to the source region 135 and the P-body region 130. A drain metal 160 to function as a drain electrode is formed on the back side of the semiconductor substrate 105 thus forming an active cell of vertical MOSFET power device. The drawing is not to scale, as the substrate 105 is typically several times thicker than the epitaxial layer 110. The MOSFET device is integrated with an internal Schottky diode by applying a Schottky metal 150 as the source metal covering the top surface over the source region 135, the P+ region 140 and the P-body region 130 and a Schottky region adjacent to the P-body region 130. An ultra shallow P implantation layer 145 is formed immediately underneath the Schottky metal 150 in the Schottky region to reduce a leakage current. A high voltage MOSFET (HV MOSFET) semiconductor power device may include a plurality of active cell 100 connected in parallel to improve current handling capability. The high voltage MOSFET (HV MOSFET) semiconductor power device further includes a termination structure surrounding the active cells in the periphery area in order to withstand the voltage near the die edge. FIG. 2-1 shows the termination structure of the high voltage MOSFET (FIV MOSFET) semiconductor power device that is integrated with a Schottky diode of this invention. The termination structure includes a plurality of field plate 125' electrically connected to floating guard rings 130' by metal conductor 150' through guard ring contact implants 140' and extending over field oxides 115' beyond the lateral boundary of guard ring 130'.

Figure 3A:
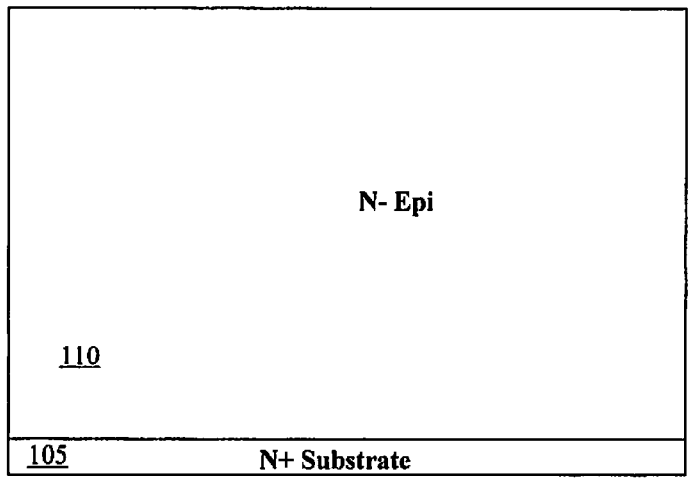
FIGS. 3A to 3F are a series of cross sectional views for showing the processing steps to manufacture a HV MOSFET device with an integrated Schottky diode of this invention.
Figures 1, 3A:
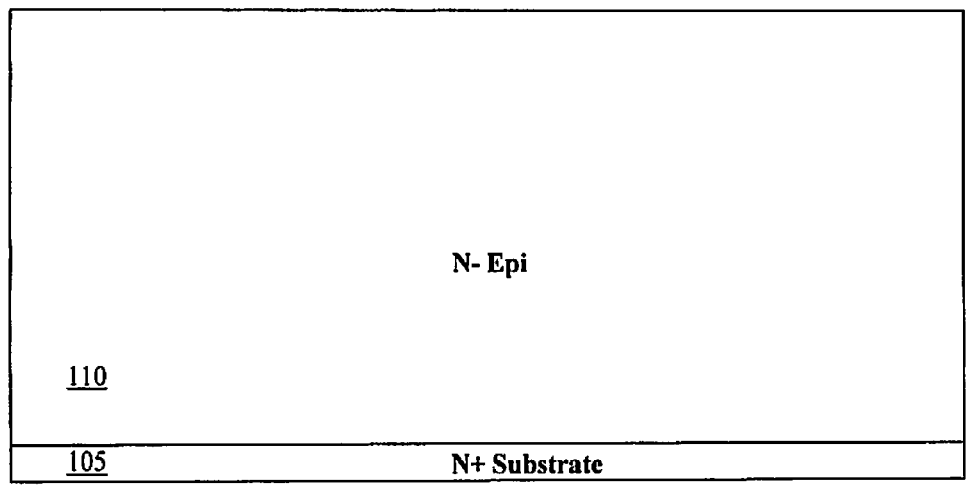
Figure 3B:
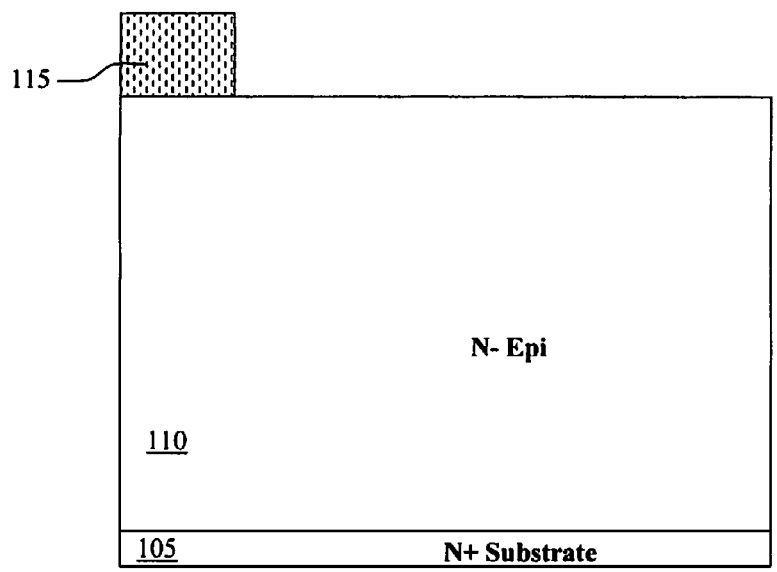
Figures 1, 3B:
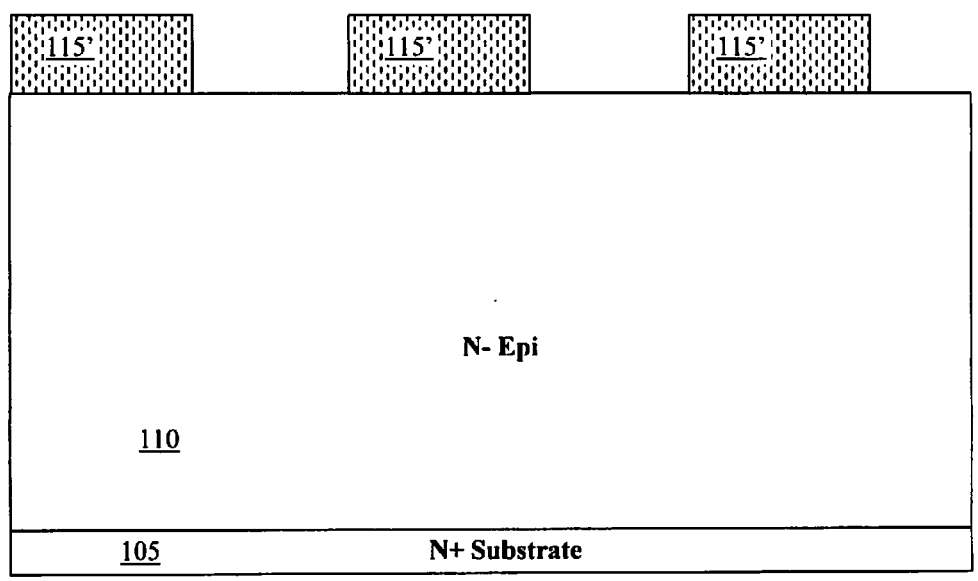
Figure 3C:
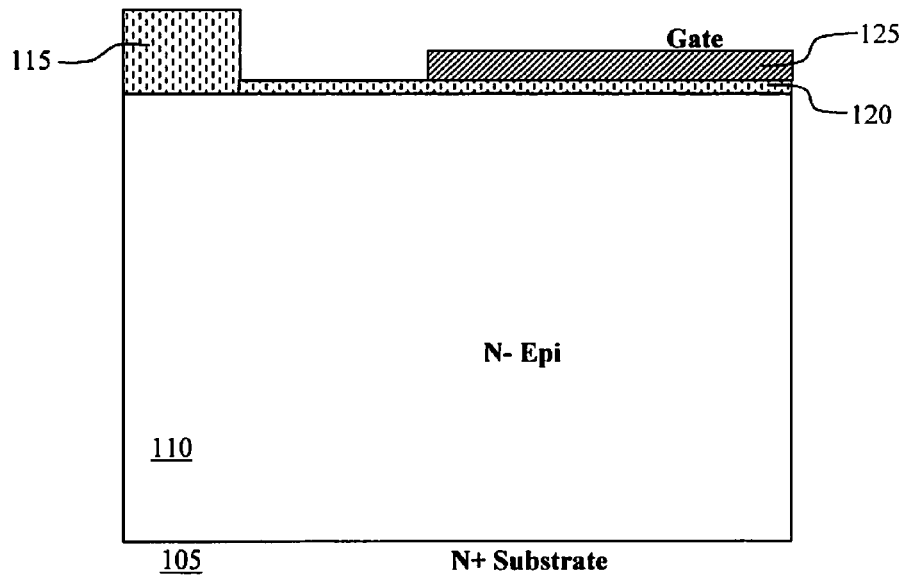
Figures 1, 3C:
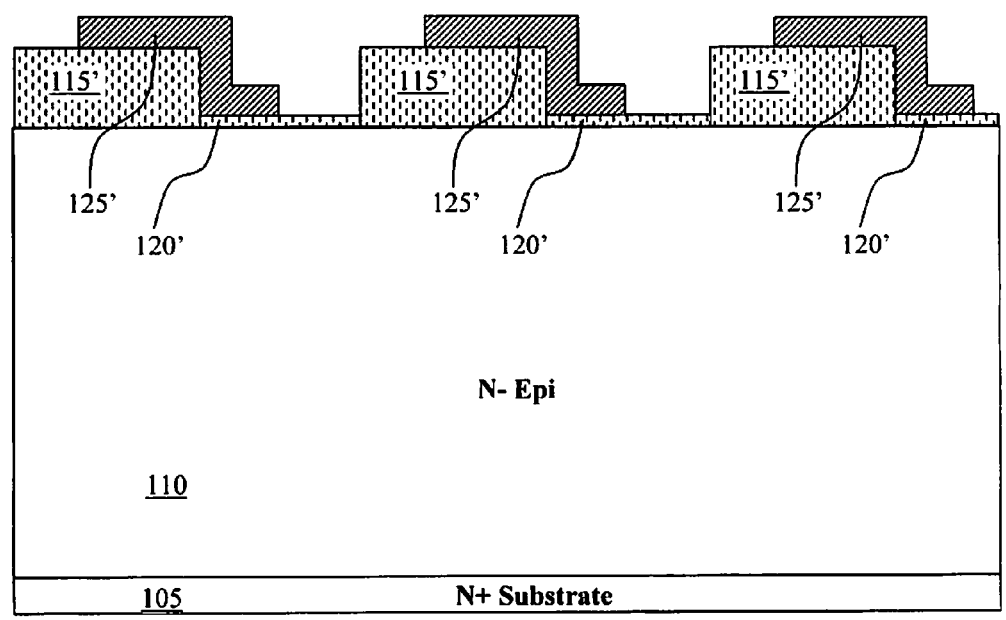
Figure 3D:
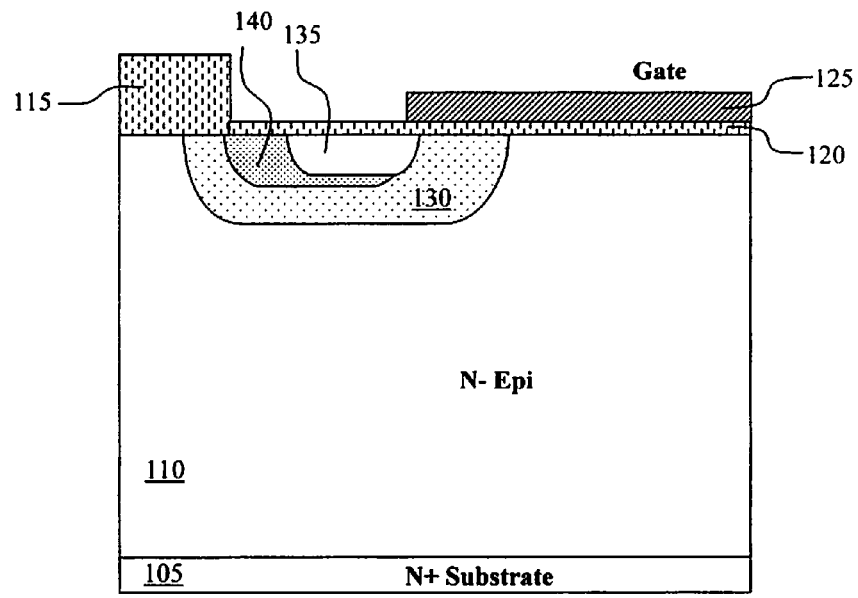
Figures 1, 3D:
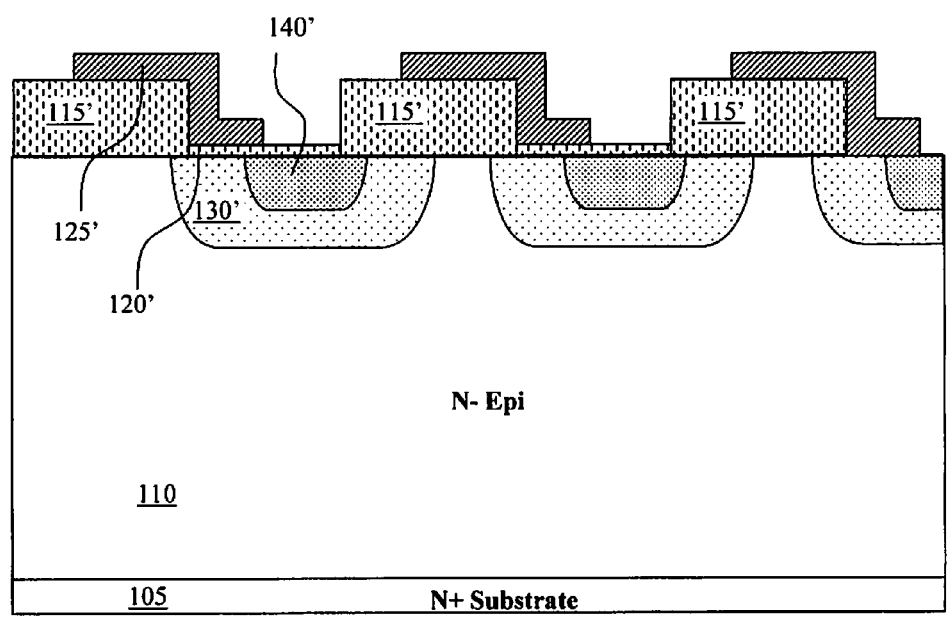
Figure 3E:
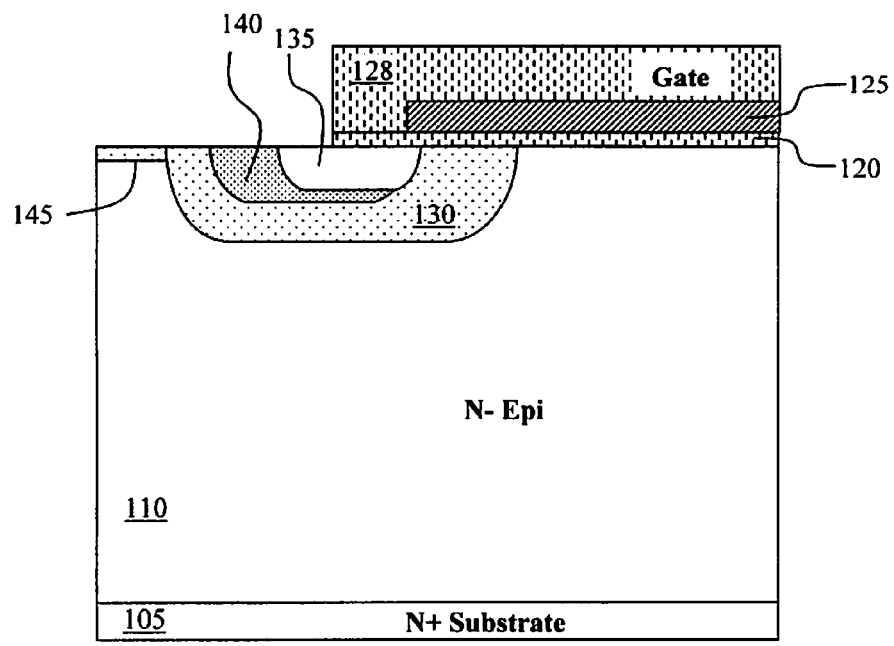
Figures 1, 3E:
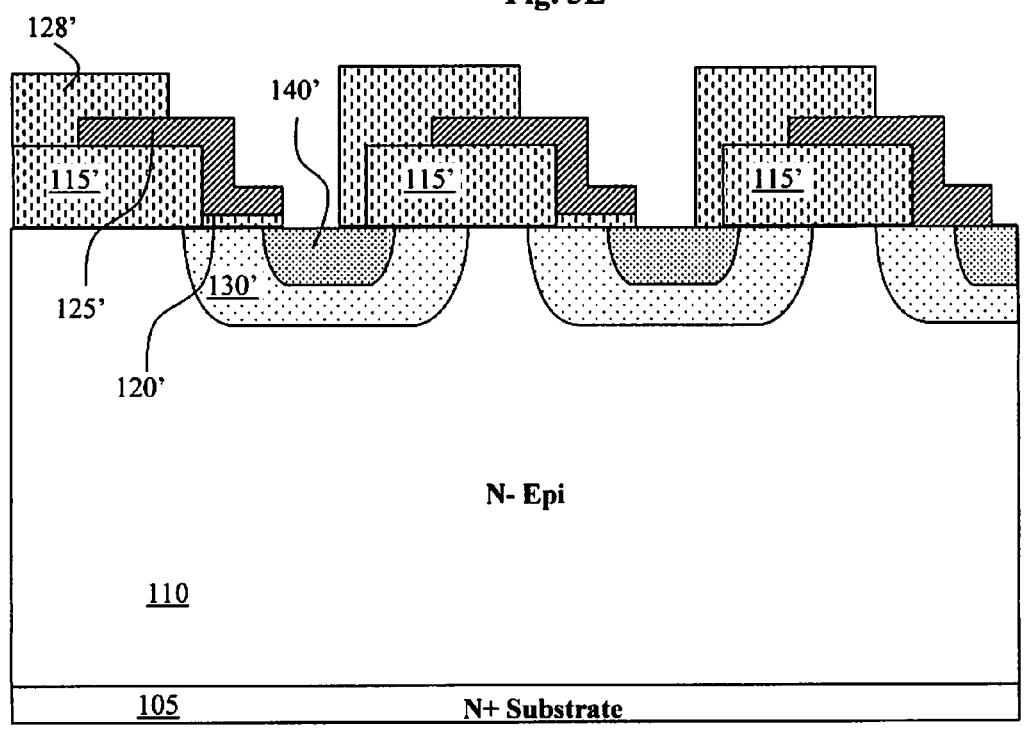
Figure 3F:
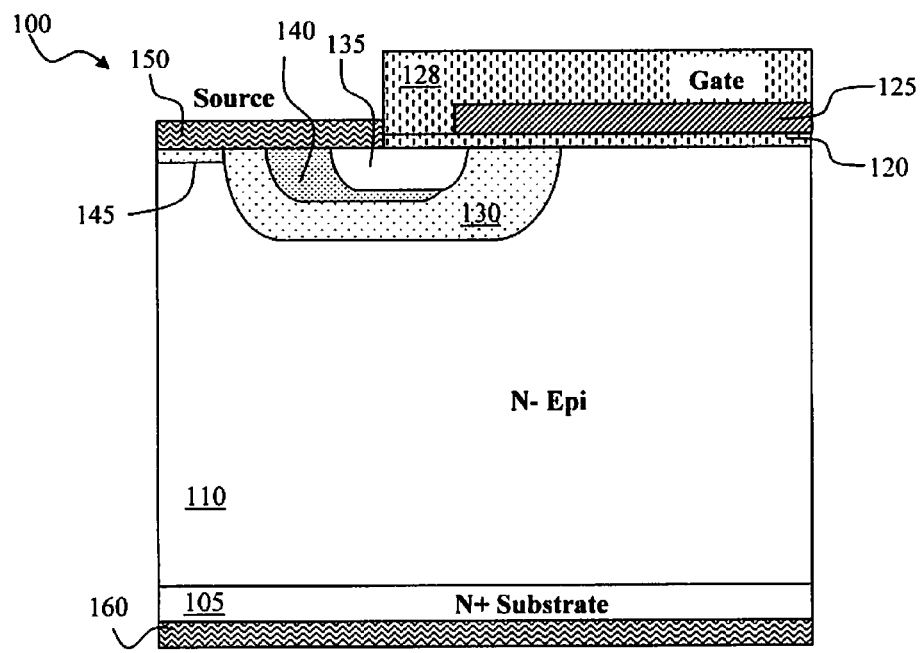
Figures 1, 3F:
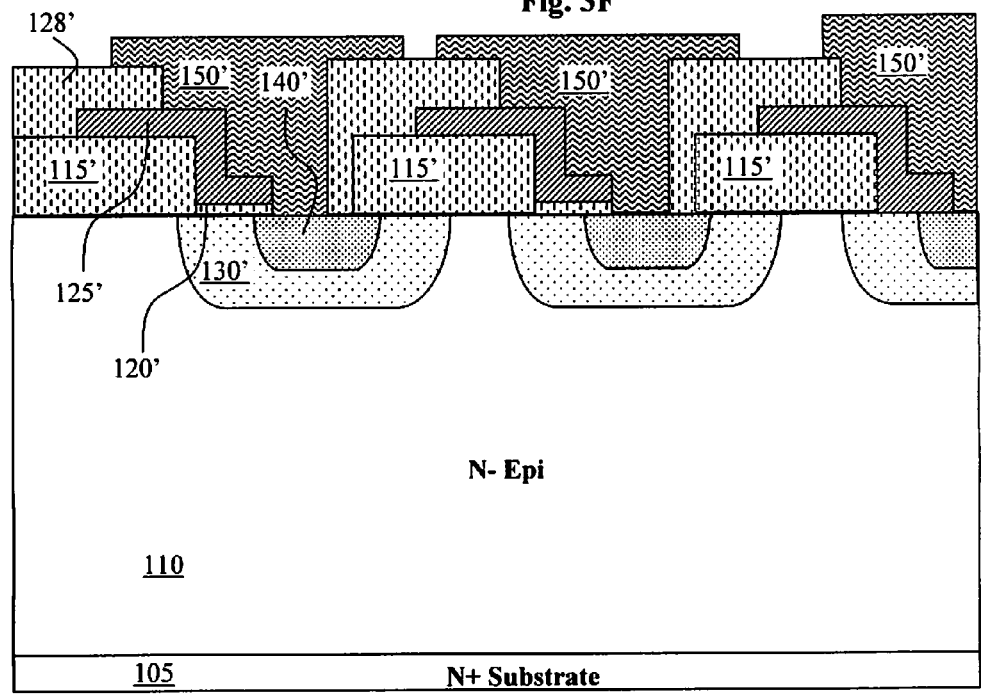

FIGS. 3A to 3F are a series of cross sectional views for illustrating the processing steps for manufacturing a high voltage MOSFET (HV-MOSFET) 100 shown in FIG. 2 and FIGS. 3A-1 to 3F-1 are the corresponding cross sectional views in termination area in each processing step. A high voltage device requires termination structures in order to withstand the voltage near the die edge. In FIGS. 3A and 3A-1, the process starts with an N buffer doping substrate 105 supporting an N– epitaxial layer 110 with a layer thickness of about 50 to 75 micrometers grown thereon. In FIGS. 3B and 3B-1, a field oxide layer is grown and etched by applying a first mask (not shown) to form filed oxide 115 in active area and 115' in termination area. In FIG. 3C, a gate oxide layer 120 is grown followed by depositing a polysilicon layer 125 on top of the gate oxide layer 120 and then patterning the polysilicon layer into the gate 125 by applying a second mask (not specifically shown). Thin oxide layer 120' and polysilicon structure 125' are formed in the same process in the termination area as shown in FIG. 3C-1. In FIG. 3D, a P-body dopant implant is carried out followed by a diffusion process to form the P-body region 130. A third mask (not shown) is applied to carry out an N+ source implant to form the source region 135. A P+implant is also performed after the removal of source implant mask to form a P+ body contact region 140 below and beside the N+ source region 135. The P-body dopant implant and the P+ implant use the existing field oxide and the gate poly 125 as a mask, and so need no additional mask. The N+ implant is at a much higher dosage than the P+ and P-body implants and will dominate in the regions where it is implanted. In the termination area FIG. 3D-1 source implant is blocked by the third mask therefore only P-body implant and P+ implant are carried out using the existing field oxide and the gate poly 125 as implant mask to form floating guard rings 130' and guard ring contacts 140' . . . . In FIG. 3E, a low temperature oxide (LTO) deposition is carried out to form an oxide layer 128 followed by applying a fourth mask (not shown) to open a contact opening through the oxide layer 128 then performing a shallow P-implant to form the shallow P-region 145. while the field oxide 115 in active area is removed during contact hole opening process to expose the area for Schottky formation in next step, filed oxides 115' in termination area FIG. 3E-1 remain while opening the contact holes through oxide layer 128' and thin oxide layer 120' as shown. In FIG. 3F, a top metal layer 150 is formed and patterned as an emitter metal layer by applying a fifth mask (not shown). A sixth mask (not shown) may be applied optionally to form and pattern a passivation layer (not shown) and a seventh mask (not shown) to form and pattern a polyimide layer (not shown) over the top surface of the device. A back side metallization process is then carried out in FIG. 3F to form the drain electrode 160 on the back side of the substrate 105. In termination area metal layer is also patterned into metal conductors 150' to electrically connect polysilicon 125' to floating guard rings 130' therefore forming a plurality of field plates 125'. Filed plates 125' and floating guard rings 130' form the termination of device in FIG. 3F-1 to sustain high voltage in the edge area. As shown in the above process, the first mask provides both filed oxides in active area to block body implantation for Schottky formation and in termination area for filed plate structure termination therefore a dedicate mask for Schottky formation is not necessary.

Figure 4:
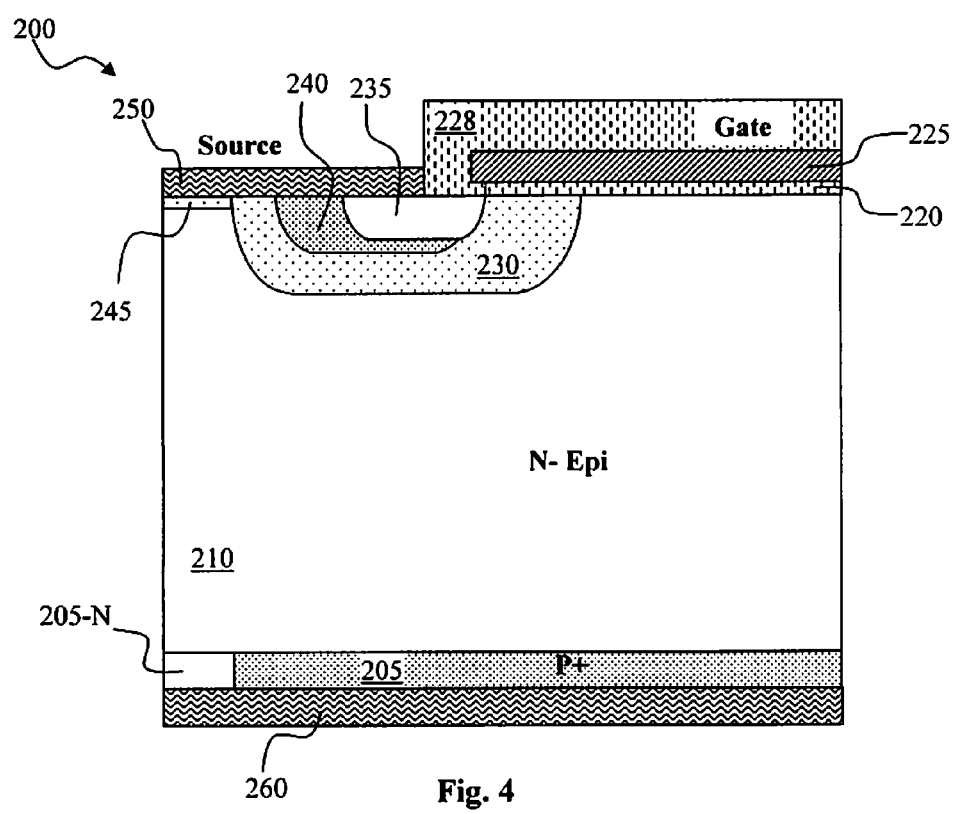
FIG. 4 is a cross sectional view of an insulated gate bipolar transistor (IGBT) device with an integrated Schottky diode of this invention.

FIG. 4 shows a cross-sectional view of an insulated gate bipolar transistor (IGBT) 200 of this invention. The IGBT 200 is formed in a semiconductor substrate 205 that has a first conductivity type, e.g., a P type substrate 205. An epitaxial layer 210 of a second conductivity type, e.g., an N– epitaxial layer 210, is supported on top of the P type substrate 205. The IGBT 200 is a vertical IGBT device with a collector electrode 260 disposed on a bottom surface of the substrate and an emitter electrode 250 disposed on a top surface. A gate 225 is supported on top of a gate insulation layer 220. An N+ source region 235 is formed underneath the emitter electrode 250 encompassed in a P-body region 230 extended below the emitter N-region 235 to a region underneath the gate insulation layer 220. The IGBT device 200 further includes a P+ doped region 240 within the P-body region 230 immediately next to the emitter N-region 235. When a gate voltage exceeding a threshold voltage is applied, the internal PNP bipolar transistor is turned on. An electrical current is conducted from the emitter region 235 through the P+ doped region 240 and the P body region 230 to the drift region as part of the N-epitaxial layer 110 to the substrate 205 and then to the collector electrode 260. The IGBT device is further integrated with an internal Schottky diode by applying a Schottky metal 250 as the emitter metal covering the top surface over the emitter region 235, the P+ region 240 and the P-body region 230. The Schottky metal 250 is in direct contact with the epitaxial layer 210 and the emitter region 235. An ultra shallow P implantation layer 245 is formed immediately underneath the Schottky metal 250 to reduce a leakage current. An N+ doped region 205-N is formed in a portion of the P+ substrate layer 205 The N+ doped region 205-N connects the collector electrode 260 to the N-Epi and allows the integrated Schottky diode to be connected between emitter electrode 250 and collector electrode 260.

The processing steps for manufacturing the IGBT device are the same as that described in FIGS. 3A to 3F, except that the starting material is a P+ substrate 250 supporting an N-epi 210, rather than N+ substrate 150 supporting an N-epi 110, and also a N+ implant is performed before back metallization to form the N+ doped region 205-N. An alternate process may begin with an N− substrate without an epitaxial layer. Before the backside metal process as shown in FIG. 3F and after a backside grinding is performed, a P+ blanket implanted at the backside, and a N+ masked implant (not shown) is followed to form the N+ substrate region 205-N. The IGBT device 200 integrated with a Schottky diode of this invention may also include the termination structure shown in FIG. 2-1 therefore no additional mask is required for the formation of integrated Schottky.

Figure 5A:
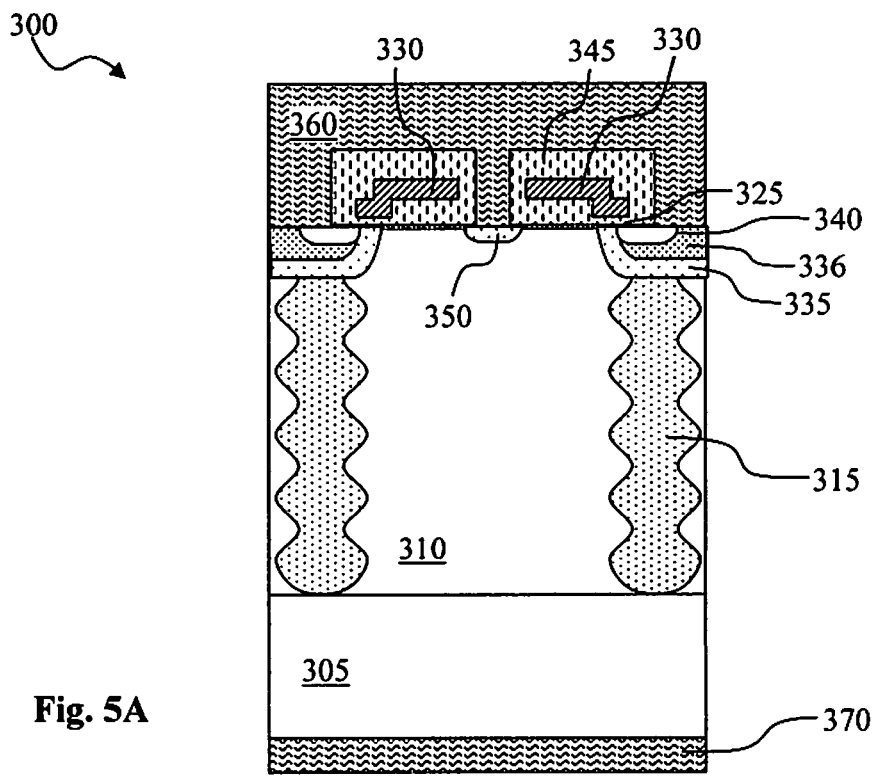
FIGS. 5A and 5B are two cross sectional views of two super-junction semiconductor power devices with an integrated Schottky diode of this invention.

FIG. 5A shows a cross sectional view of a super-junction semiconductor power device 300 integrated with a Schottky diode of this invention. The super-junction device 200 is supported on an N+ silicon substrate 305 with an epitaxial layer 310 with P-doped vertical columns 315 in the epitaxial layer formed through multiple epitaxial layer growth and implantation processes as described below. A planar gate 330 is formed on top of a gate oxide layer 325. A P-body region 335 is formed in the epitaxial layer below the gate oxide layer 325 encompassing an N+ source region 340. An additional P+ body contact region 336 is formed within the P-body region 335. The P-body regions 335 are formed as over the P-dopant columns 315 as a P+ region within the P-dopant columns 315 immediate next to the source region 340. A source metal 360 covering the top surface with direct contact to the source region 340 and the P-body region 335. A drain metal 370 to function as a drain electrode is formed on the back side of the semiconductor substrate 305 thus forming a vertical super-junction power device. The super-junction device is integrated with an internal Schottky diode by applying a Schottky metal 360 as the source metal covering the top surface over the source region 340, the P+ region 336 and a Schottky contact P-dopant region 350. The Schottky metal 360 is in direct contact with the epitaxial layer 310 and the source region 340. The ultra shallow P implantation layer 350 is formed immediately underneath the Schottky metal 360 between the gates 330 to reduce a leakage current. The super-junction semiconductor power device 300 integrated with a Schottky diode of this invention may also include the termination structure shown in FIG. 2-1 therefore no additional mask is required for the formation of integrated Schottky.

Figure 5B:
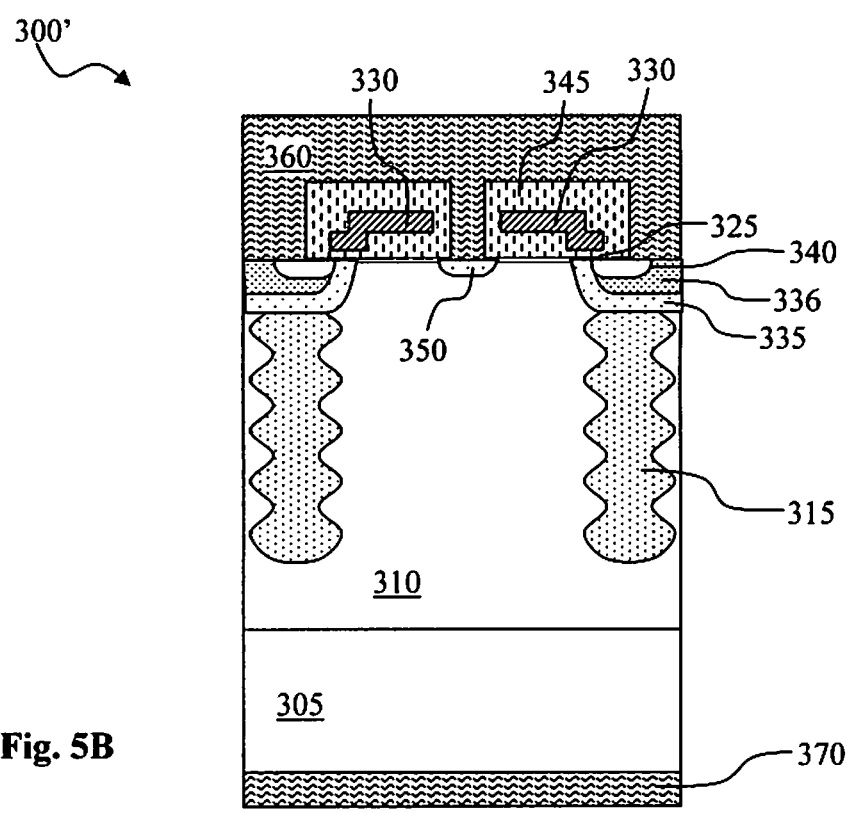

FIG. 5B is a cross sectional view of another super-junction semiconductor power device 300' that has a similar structural features of FIG. 5B. The only difference is the P-doped columns 315' extend to a depth in the epitaxial layer 310 at a distance above the bottom the epitaxial layer 310 interfacing with the bottom substrate N+ layer 305, whereas in the power device 300 of FIG. 5A, the P-doped columns 315 extend all the way to the bottom of the epitaxial layer 310. The super-junction semiconductor power device 300' integrated with a Schottky diode of this invention may also include the termination structure shown in FIG. 2-1 therefore no additional mask is required for the formation of integrated Schottky.

Figure 6A:
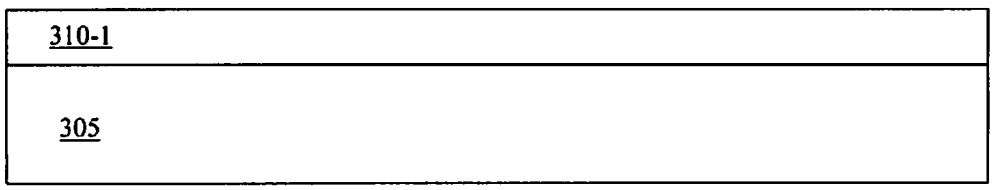
FIGS. 6A to 6I are serial cross sectional views for describing the manufacturing processes to fabricate a super-junction semiconductor power device of FIG. 5A.
Figure 6B:
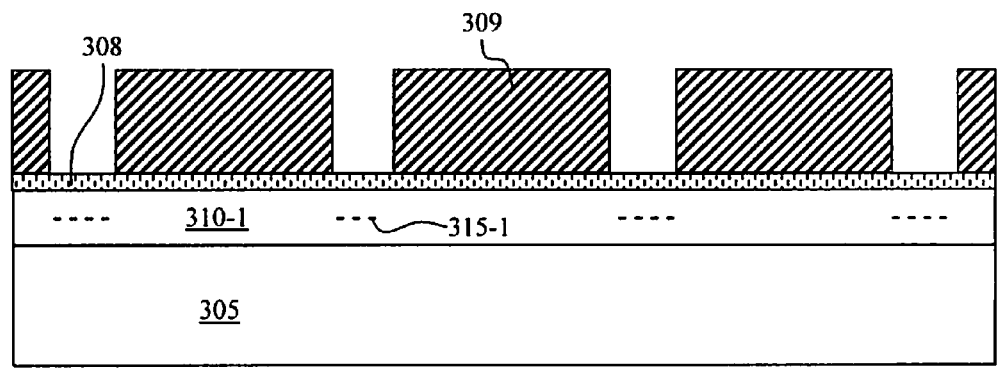
Figure 6C:
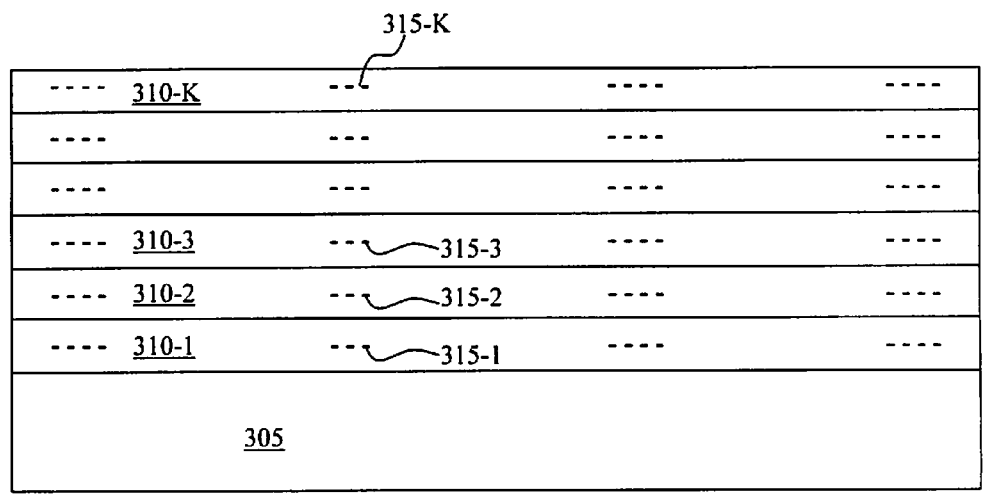
Figures 1, 6D:
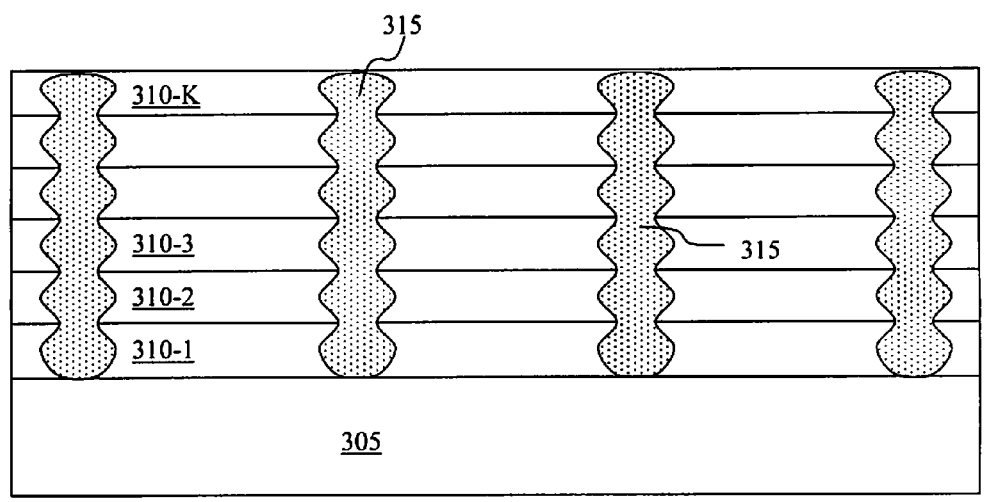
Figures 2, 6D:
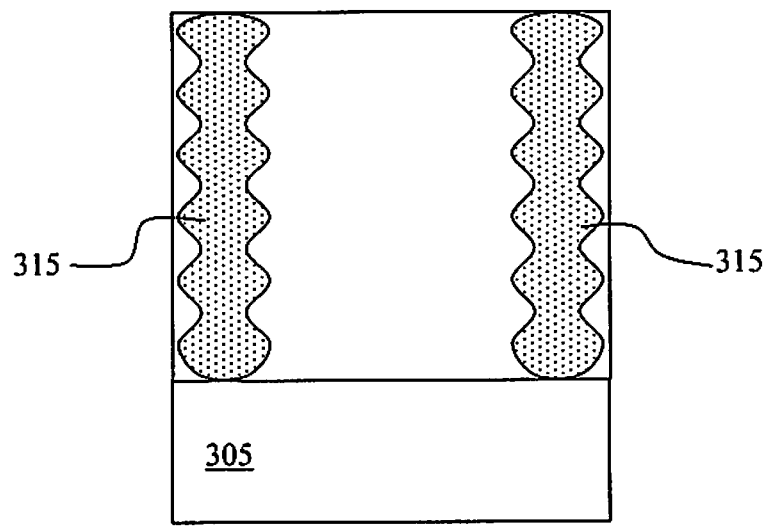

FIGS. 6A to 6J are a series of cross sectional views for illustrating the processing steps for manufacturing a super-junction semiconductor power device with integrate Schottky diode to reduce the Qrr as that shown in FIG. 5A. In FIG. 6A, the process starts with growing a first N− epitaxial layer 310-1 on an N+ substrate 305. In FIG. 6B, a mask (not shown) is applied to form the align-mark followed by growing a pad oxide layer 308. Then a mask 309 is applied to etch the oxide and carry out a boron implant at 200 Key to form the P-regions 315-1 in the first epitaxial layer 310-1. The mask 309 is removed followed by an anneal process at 900° Celsius for 30 minutes to repair the implantation damages. The oxide pad 308 is removed followed by growing a second epitaxial layer 310-2 to repeat the above processing steps to form the second set of P-regions 315-2 in the second epitaxial layer 310-2. The same steps are repeated to form multiple epitaxial layers 310-1 to 310-K implanted with 315-1 to 315-K in each epitaxial layer, as shown in FIG. 6C. In FIG. 6D, an anneal process is carried out at 1150° Celsius for 400-600 minutes to diffuse the boron implanted regions to form multiple P-doped columns 315.

In FIG. 6D-1, an anneal process is carried out at 1150° Celsius for 400-600 minutes to diffuse the boron implanted regions to form multiple P-doped columns 315. FIG. 6D-2 shows a subsection of the figure from FIG. 6D-1, from which the remainder of the steps of this process is demonstrated. For simplicity, in these steps, the multiple N− epitaxial layers 310-1 to 310-K are illustrated as a single continuous N− epitaxial layer 310.

Figure 6E:
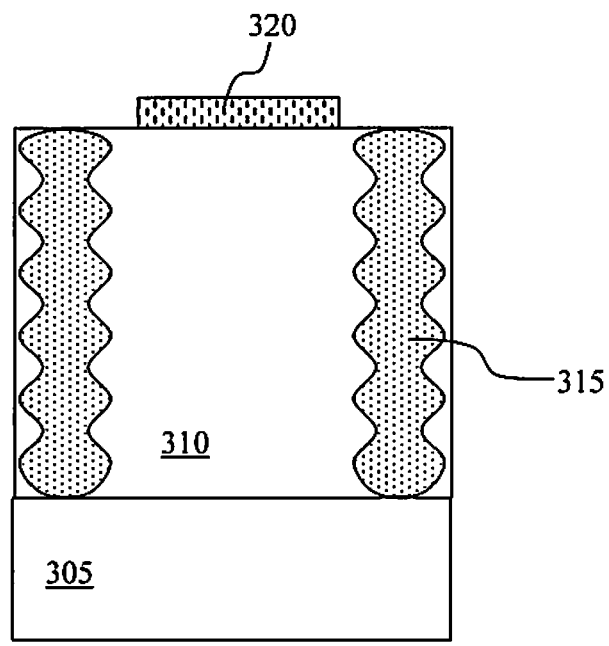
Figure 6F:
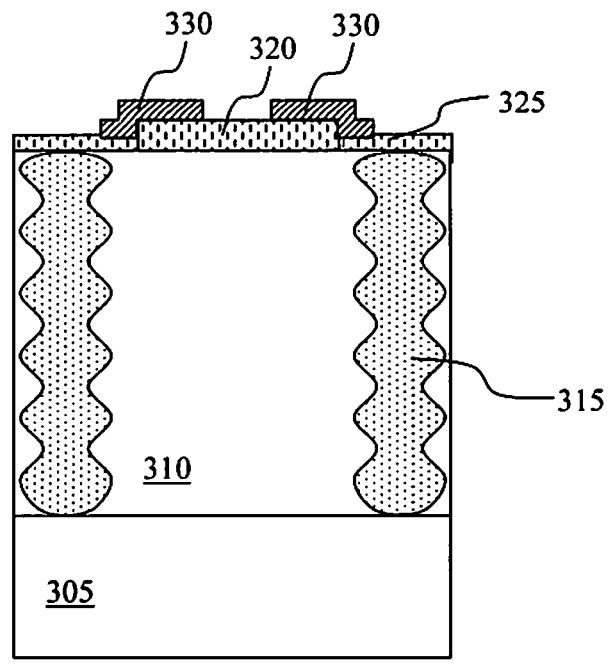
Figure 6G:
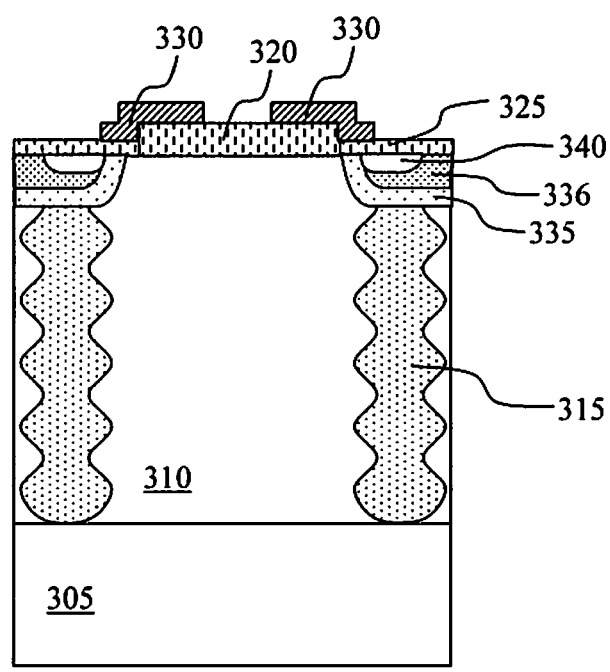
Figure 6H:
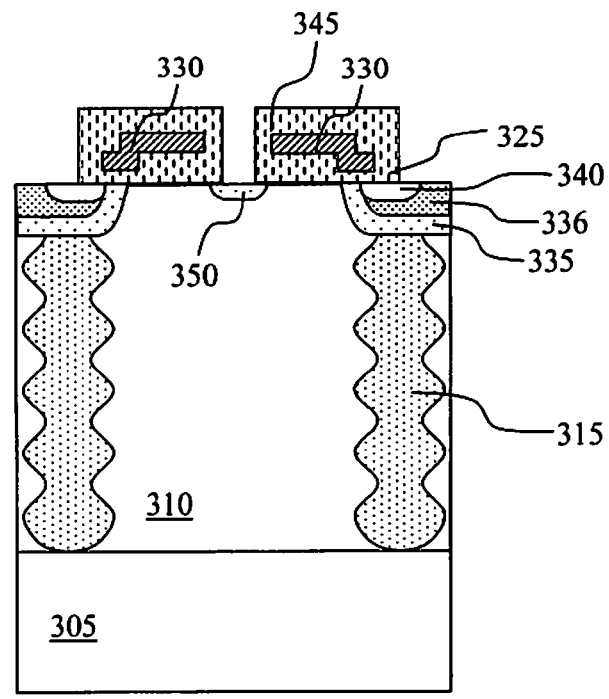
Figure 6I:
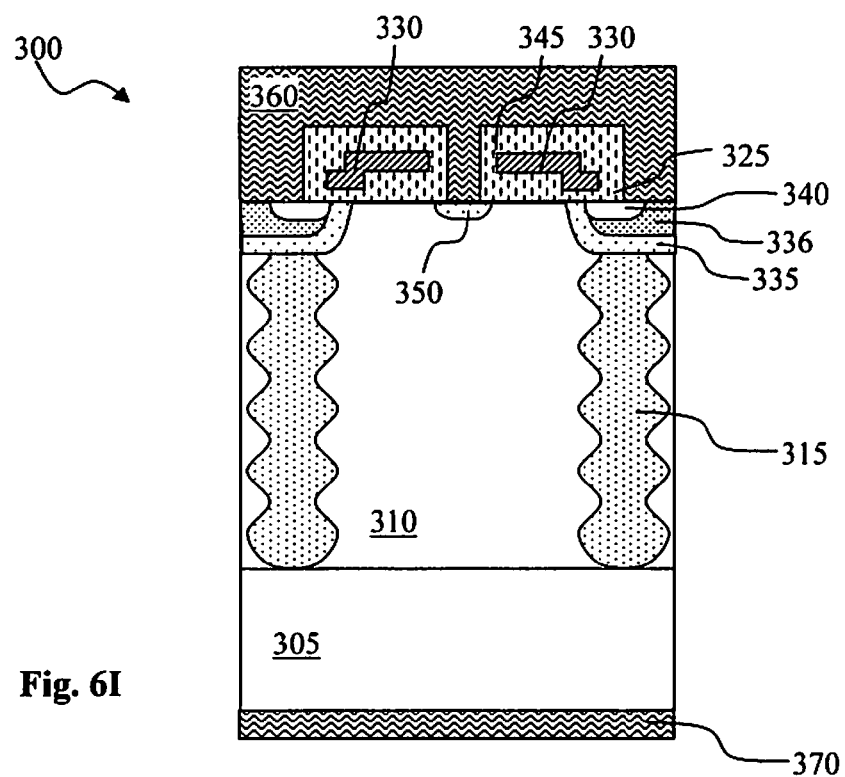

In FIG. 6E, a field oxide layer 320 is grown and etched by applying a first mask (not shown). In FIG. 6F, a gate oxide layer 325 is grown followed by depositing a polysilicon layer 330 on top of the gate oxide layer 325 and field oxide 320 and then patterning the polysilicon layer into the gate 330 by applying a second mask (not specifically shown). In FIG. 6G, P dopant implants are carried out to form the P+ body regions 336 and P-body regions 335. A source mask as a third mask is applied to carry out an N+ source implant out to form the source region 340. In FIG. 6H, a BPSG insulation deposition is carried out followed by applying a fourth mask (not shown) to carry out a contact opening process to form the insulation layer 345 with contact openings followed by performing a Schottky implant to form the P-dopant Schottky contact regions 350 below the contact openings between the gate. In FIG. 6I, a Schottky metal layer 350 also functioning as a source metal is formed and patterned on the top surface using a fifth mask, and a backside metal 360 is formed on the bottom surface to function as a drain electrode. Termination structure as shown in FIG. 2-1 is formed at the same process as illustrated in FIGS. 3A-1 to 3F-1.

Figure 7A:
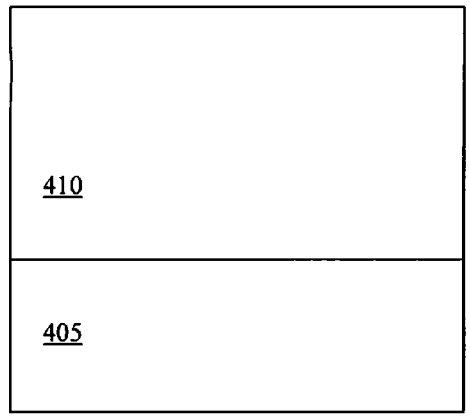
FIGS. 7A to 7E are serial cross sectional views for describing the manufacturing processes to fabricate another super-junction semiconductor power device of this invention.
Figure 7B:
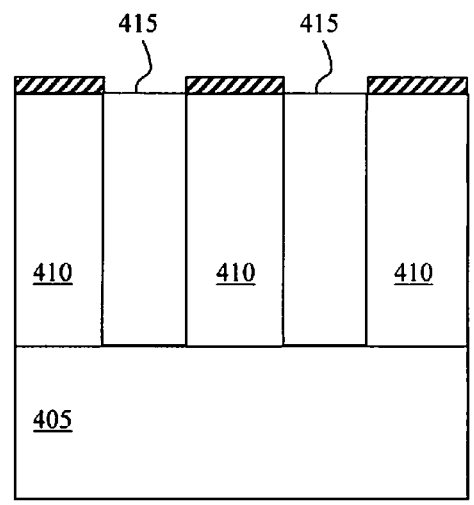
Figure 7C:
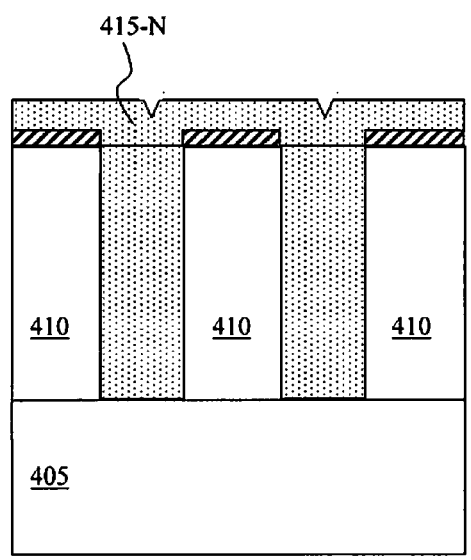
Figure 7D:
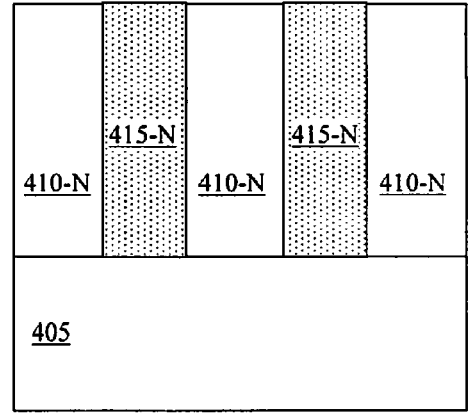

FIGS. 7A to 7E are a series of cross sectional views for illustrating the alternate processing steps for manufacturing a super-junction semiconductor power device with integrated Schottky diode to reduce the Qrr. These steps show an alternate way of making the P-columns 315. In FIG. 7A, the process starts with growing an N− epitaxial layer 410 on an N+ substrate 405. In FIG. 7B, a mask (not shown) is applied to open a plurality of deep trenches 415 in the epitaxial layer 410. In FIG. 7C, the deep trenches are filled with P-doped material 415-P then in FIG. 7D, a planarization process by applying a chemical-mechanical planarization (CMP) process to remove the P-doped material from the top surface above the epitaxial layer 410. A plurality of P and N columns 415-P and 410-N are therefore formed in the epitaxial layer 410.

Figure 7E:
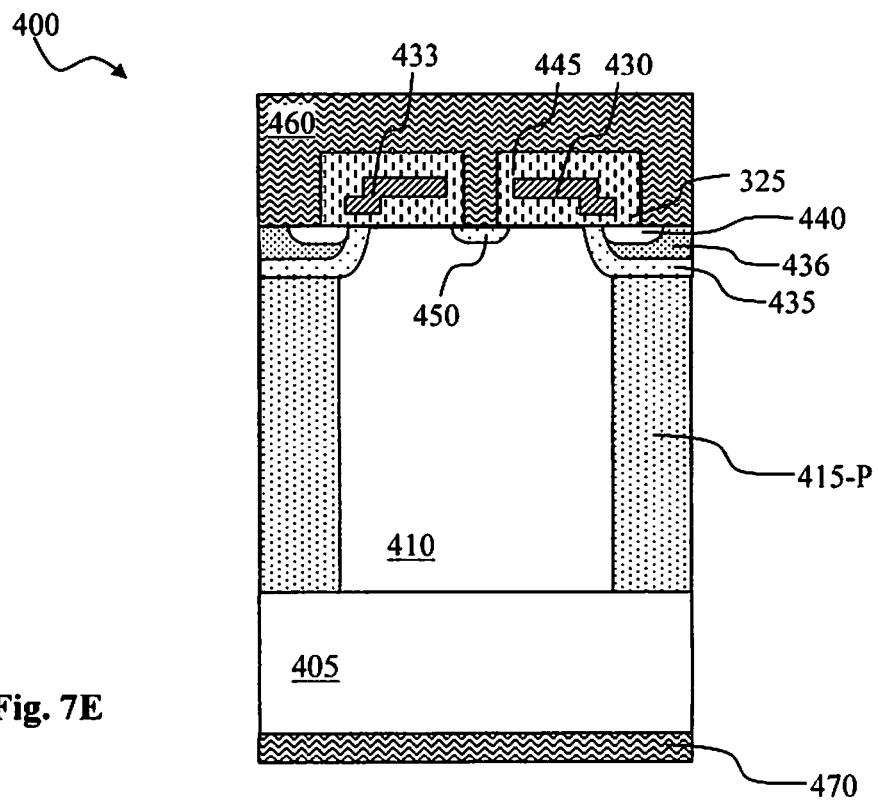

In FIG. 7E, the same processes as that described in FIGS. 6E to 6I are performed to form a super-junction semiconductor power device 400 integrated with a Schottky diode. The super-junction device 400 is supported on an N+ silicon substrate 405 with an N-epitaxial layer 410 with P-doped vertical columns 415-P in the epitaxial layer formed on top of the N+ substrate 405, e.g., an arsenide dopant substrate layer in an embodiment as shown. A planar gate 430 is formed on top of a gate oxide layer 425. A P-body region 435 is formed in the epitaxial layer below the gate oxide layer 425 encompassing an N+ source region 440. For a high voltage application, the P-body regions 435 is formed above the P-dopant columns 415-P. The P+ region 436 is formed within the P-body 435 immediately next to the source region 440. A source metal 460 covering the top surface with direct contact to the source region 440 and the P-body region 435. A drain metal 470 to function as a drain electrode is formed on the back side of the semiconductor substrate 405 thus forming a vertical super-junction power device. The super-junction device is integrated with an internal Schottky diode by applying a Schottky metal 460 as the source metal covering the top surface over the source region 440, the P+ region 436 and a Schottky contact P-dopant implant region 450. The Schottky metal 460 is in direct contact with the epitaxial layer 410 and the source region 440. The ultra shallow P implantation layer 450 is formed immediately underneath the Schottky metal 460 between the gates 430 to reduce a leakage current. Termination structure as shown in FIG. 2-1 is formed at the same process as illustrated in FIGS. 3A-1 to 3F-1.

Figure 8:
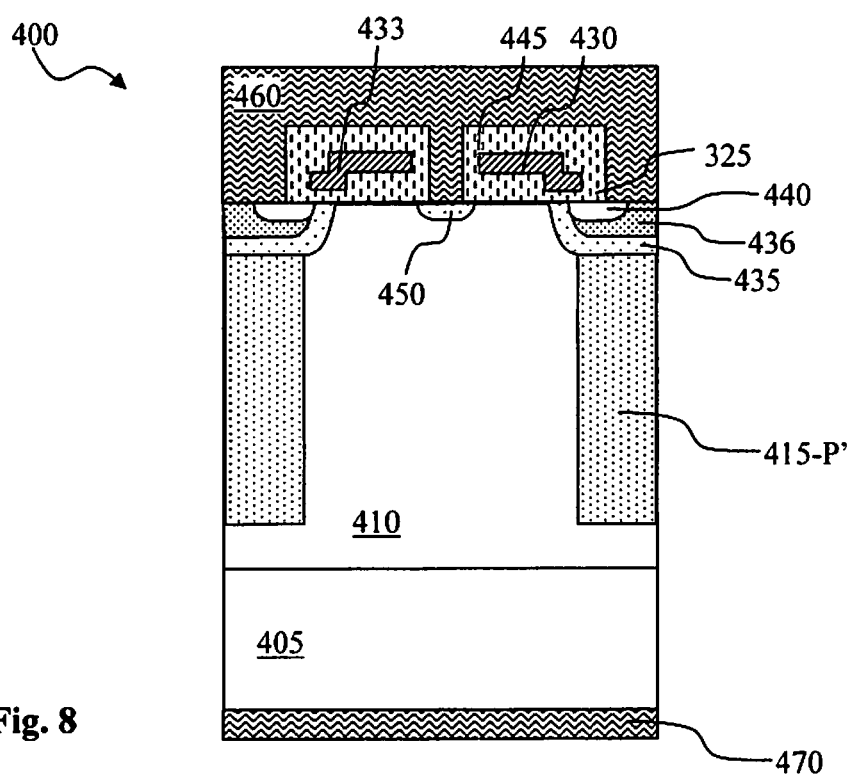
FIG. 8 is a cross sectional view for showing an alternate super-junction semiconductor power device integrated with a Schottky diode of this invention.

FIG. 8 is a cross sectional view of another super-junction semiconductor power device 400' that has a similar structural features of FIG. 7E. The only difference is the P-doped columns 415-P' extend to a depth in the epitaxial layer 410 at a distance above the bottom the epitaxial layer 410 interfacing with the bottom substrate N+ layer 405.

Although the present invention has been described in terms of the presently preferred embodiment, it is to be understood that such disclosure is not to be interpreted as limiting. For example, gate dielectric can be a more general term for gate oxide, and a hard mask such as nitride or deposited oxide may be used instead of field oxide. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A method for manufacturing a semiconductor power device in a semiconductor substrate comprises an active cell area and a termination area comprising:
   growing and patterning a field oxide layer in said termination area and also in said active cell are on a top surface of said semiconductor substrate wherein the field oxide layer in the termination area is patterned into a plurality of field oxide segments with a gap between two adjacent segments;
   growing a gate oxide layer on said top surface of said semiconductor substrate followed by depositing and patterning a polysilicon layer to form a gate segment on top of the gate oxide layer in the active cell area at a gap distance away from said field oxide layer in the active cell area and patterning the polysilicon layer in the termination area for partially covering a top surface of the field segments, a sidewall of the field oxide segments and partially over a part of the gap between the field oxide segments in the termination area; and
   performing a blank body dopant implant to form body dopant regions substantially aligned with said gap between the field oxide layer and the gate segment in the active cell area followed by diffusing said body dopant regions into body regions in the active cell area of said semiconductor substrate and wherein the blank body dopant implant also simultaneously forming guard rings in the semiconductor substrate not covered by the field oxide segments in the termination area.

2. The method of claim 1 further comprising:
   implanting high concentration body-dopant regions encompassed in and having a higher dopant concentration than said body regions in the active cell area and in the guard rings in the termination area and
   applying a source mask to block the guard rings in the termination area to implant source regions having a conductivity opposite to said body region in the active cell area with said source regions encompassed in said body regions and surrounded by said high concentration body-dopant regions.

3. The method of claim 2 further comprising:
   depositing an insulation layer on top of said semiconductor power device and applying a contact metal mask to open contact openings to contact the body and source regions in the active cell area and the guard rings in the termination area followed by removing said field oxide in the active cell area; and
   depositing a Schottky metal layer filling in said contact openings to contact said body regions and said source regions to form integrated Schottky diodes for said semiconductor power device in said active cell area.

4. The method of 2 further comprising:
   depositing an insulation layer on top of said semiconductor power device and applying a contact metal mask to open contact openings to contact the body and source regions in the active cell area and the guard rings in the termination area followed by removing said field oxide in the active cell area; and
   implanting a hallow body-dopant regions disposed adjacent to said body regions immediately below said top surface of said semiconductor substrate having a depth significantly shallower than said body regions.

5. The method of claim 2 wherein:
   said step of performing a blank body dopant implant comprises a step of implanting a P-type dopant to said body dopant region in an N-type epitaxial layer supported on a N-type semiconductor substrate and implanting N type source regions encompassed in said P-type body-regions.

6. The method of claim 2 wherein:
   said step of performing a blank body dopant implant comprises a step of implanting a N-type dopant to said body dopant region in an P-type epitaxial layer supported on a P-type semiconductor substrate and implanting P-type source regions encompassed in said N-type body-regions.

7. The method of claim 2 wherein:
   said step of manufacturing said semiconductor power device further comprises a step of manufacturing a MOSFET power device.

8. The method of claim 2 wherein:
   said step of manufacturing said semiconductor power device further comprises a step of manufacturing an IGBT power device.

9. The method of claim 3 wherein:
said step of manufacturing said semiconductor power device further comprises a step of manufacturing an IGBT power device in a an N-type semiconductor substrate and implanting a P-type bottom layer with N-type dopant regions near a bottom surface of said semiconductor substrate corresponding to said integrated Schottky diodes in said active cell area.

10. The method of claim 2 wherein:
said step of manufacturing said semiconductor power device further comprises a step of manufacturing a superjunction semiconductor substrate by forming in said semiconductor substrate alternating N-type and P-type dopant columns in said semiconductor substrate below said body-dopant regions before the step of growing and patterning the field oxide layer.

11. The method of claim 2 wherein:
said step of manufacturing said semiconductor power device further comprises a step of manufacturing a superjunction semiconductor substrate by forming said semiconductor substrate in a N-type semiconductor substrate with P-type columns underneath said body dopant regions doped with a P-type dopant and N-type columns between said P-type columns before the step of growing and patterning the field oxide layer.

* * * * *